(12) United States Patent
Schuntermann et al.

(10) Patent No.: US 7,017,429 B2
(45) Date of Patent: Mar. 28, 2006

(54) CONTINUOUS TEST FLOW METHOD AND APPARATUS

(75) Inventors: Joerg Schuntermann, Drobollach (AT); Markus Sickmoeller, Dresden (DE); Franz Brosi, Melaka (MY); Mareike Schlichting, Munich (DE)

(73) Assignees: Infineon Technologies Richmond, LP, Sandston, VA (US); Infineon Technologies AG, Munich (DE)

( * ) Notice: Subject to any disclaimer, the term of this patent is extended or adjusted under 35 U.S.C. 154(b) by 176 days.

(21) Appl. No.: 10/425,995

(22) Filed: Apr. 30, 2003

(65) Prior Publication Data
US 2004/0216537 A1 Nov. 4, 2004

(51) Int. Cl.
*G01F 9/00* (2006.01)
(52) U.S. Cl. .................................... 73/865.8
(58) Field of Classification Search ............... 73/865.8; 198/339.1, 341.01; 700/113, 121, 228, 230; 414/222.13, 222.07
See application file for complete search history.

(56) References Cited

U.S. PATENT DOCUMENTS

| 5,856,923 A | * | 1/1999 | Jones et al. | 700/121 |
| 6,427,092 B1 | * | 7/2002 | Jones et al. | 700/121 |

* cited by examiner

*Primary Examiner*—Robert Raevis
(74) *Attorney, Agent, or Firm*—Staas & Halsey LLP

(57) ABSTRACT

A method for testing devices produced in front end lots involving loading a plurality of front end lots into a tester without requiring the tester to complete tests on a previous front end lot. A secondary lot of devices is unloaded from the tester, the secondary lot containing devices from a plurality of front end lots. The plurality of front-end lots may form a batch. In this case, a plurality of secondary lots unloaded from the tester could correspond to the front-end lots, and could be considered to be part of the same batch. All secondary lots of the batch, except for the last secondary lot of the batch, may contain only pass devices, such that all fail devices from the batch are unloaded and then tested together, in the last secondary lot. The loading of the front-end lots may be asynchronous with the unloading of the secondary lots.

5 Claims, 7 Drawing Sheets

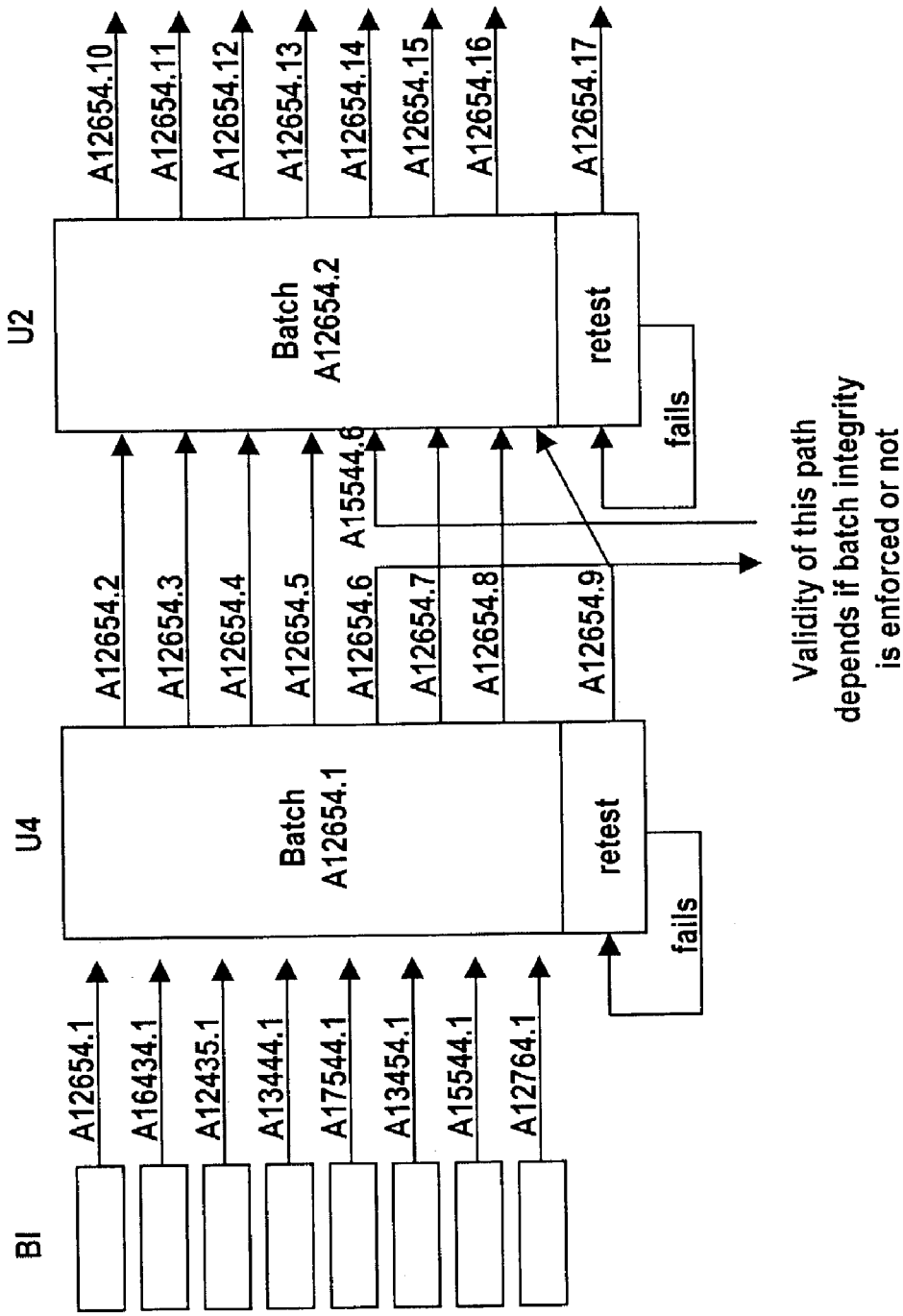

CONTINUOUS TEST FLOW METHOD AND APPARATUS

BACKGROUND OF THE INVENTION

Mass production semiconductor devices are ordinarily tested before being sold. In this process, each and every device may be tested on specialized test equipments.

Semiconductor devices are manufactured in lots. Although the number is somewhat arbitrary, a lot could contain perhaps 1,000 semiconductor devices. According to known testing methods, each lot is tested by itself so as to keep the devices of the lot together. FIG. 1 is a schematic view of a known testing method. In FIG. 1, the first lot is labeled A11111.1. All devices of the first lot are loaded into the tester, which is represented by the shaded area, and the first lot devices are tested together. After testing is complete, the devices which failed are perhaps retested. Once finished with the first lot, the tester is unloaded. As can be seen, the same identification number, A11111.1, is used for the first lot after testing. The second lot, labeled A22222.1 is next loaded into the tester and tested in the same manner as was done for the first lot. Test equipment manufacturers are for instance Advantest and Teradyne. After the second lot is completed, a third lot is tested in a similar fashion.

As can be seen from FIG. 1, there are gaps between the first and second and second and third lots. These gaps relate to timing delays. During the delay, devices must be unloaded, test data must be downloaded from the test machine, the test machine must be reset and the next front end lot ("pre-test lot") of devices must be loaded. The test methodology is similar to a conveyor belt which must be completely emptied before being reloaded. By analogy, the delay is similar to the delay between loading the first device.

The schematic shown in FIG. 1 provides lot integrity. After each stage of testing is complete, the operator can determine if the front end lot (or manufactured lot) experienced a problem during manufacture. For example, if the tests show that an unusually high percentage of the devices failed the test, then the conditions of manufacture can be reviewed and the lot can be specially treated such that a buyer does not unknowingly purchase devices which could have marginal quality. However, the delay associated with separately testing each manufactured lot is considerable.

SUMMARY OF THE INVENTION

It is one potential object of the present invention to minimize testing delay to and increase the throughput of semiconductor testing equipment. To possibly address this or other objects, the inventors propose a method for testing devices produced in front end lots, which involves loading a plurality of front end lots ("pre-test lots") into a tester without requiring the tester to complete tests on a previous front end lot. A secondary lot ("cost-test lot") of devices is unloaded from the tester, the secondary lot containing devices from a plurality of front end lots.

One possibility is that the devices of the front end lot, which contributed to the secondary lot, may be sorted from the secondary lot. Sorting from the secondary lot may be performed only if at least a predetermined number of failed devices originated from the front end lot.

All of the failed devices from the batch may be retested together.

The loading of the front end lots may be asynchronous with the unloading of the secondary lots.

The number of failed devices in the batch could be determined. If the number of failed devices exceeds a limit number, the process may determine which front end lots contribute to the devices in the secondary lot. The front end lots contributing to the secondary lot can then be subjected to additional scrutiny.

One possibility is that the devices of the front end lot, which contributed to the secondary lot, may be sorted from the secondary lot. Sorting from the secondary lot may be performed only if at least a predetermined number of devices in the secondary lot originated from the front end lot.

A predetermined number of devices may be unloaded in at least the initial secondary lots. This predetermined number may be the number of devices the tester can accommodate in an output load.

A plurality of secondary lots may be unloaded from the tester. When each secondary lot is unloaded, test data relating to the corresponding front end lots may be aggregated to floating front end data summaries such that data aggregation on a front end lot basis is performed without waiting for all secondary lots of the batch to be unloaded.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 3A shows a schematic layout of a test operation involving two different tests, represented by U4 and U2;

DETAILED DESCRIPTION OF THE PREFERRED EMBODIMENTS

Figure 2:
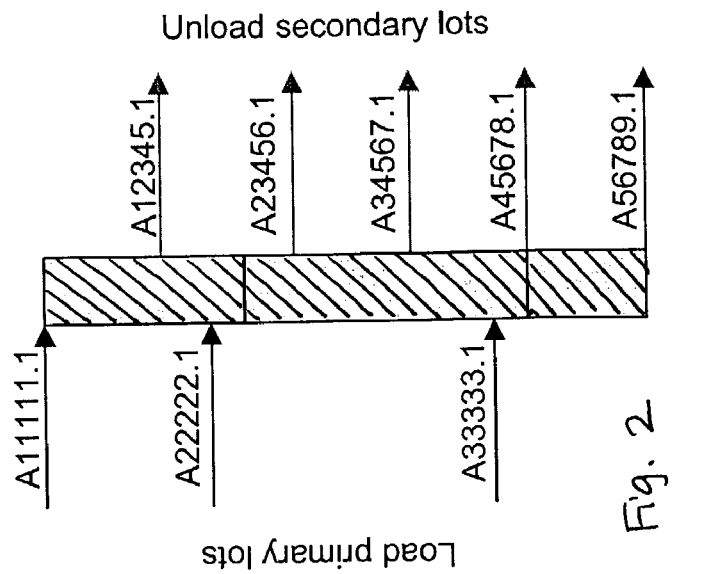
FIG. 2 is schematic view of a test scenario according to one embodiment of the invention.

Reference will now be made in detail to the preferred embodiments of the present invention, examples of which are illustrated in the accompanying drawings, wherein like reference numerals refer to like elements throughout.

FIG. 2 is schematic view of a test scenario according to one embodiment of the invention. In FIG. 2, as in FIG. 1, the arrows directed into the shaded-area indicate lots being fed to the test equipment. However, in contrast with FIG. 1, in FIG. 2, there are no brakes between where the different lots are fed. FIG. 2 represents a continuous test flow process in which the lots are fed into the test equipment without waiting for the tests of the previous lot to be completed.

Figure 1:
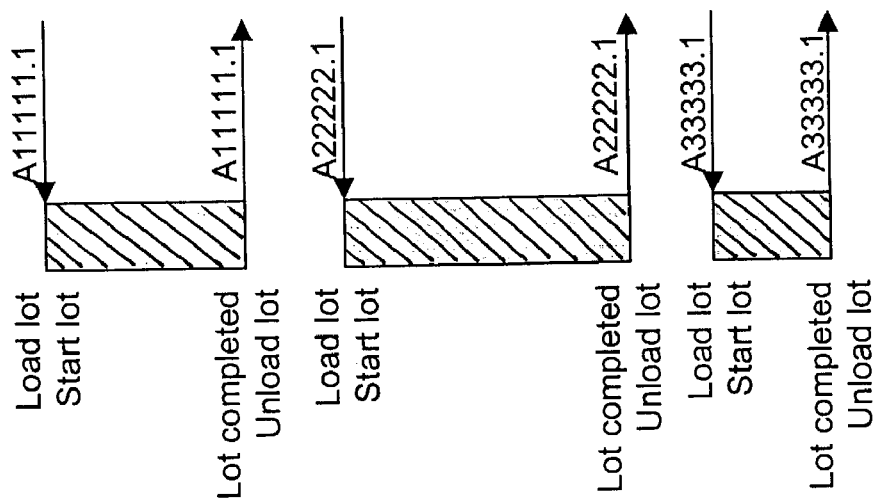
FIG. 1 is a schematic view of a known testing method.

In FIG. 1, there was a one-to-one correspondence between the lots being fed into the test equipment and the lots unloaded from the test equipment. After all of the devices of one lot were tested, the devices of this lot were unloaded before the next lot was loaded. In FIG. 2, there is no direct correlation between the lots fed into the test equipment and the lots unloaded from the test equipment. When the lots are unloaded is somewhat arbitrarily. Ordinarily, the number of devices to be unloaded would be a fixed number. Perhaps this fixed number could be the maximum number of devices that test equipment can accommodate in an output holder or some other number chosen by the operator.

FIG. 2 shows one example of how three input lots are tested. After the test is completed on these three lots, the test equipment is stopped as was done after each lot for the configuration shown in FIG. 1. Thus, the three lots being fed into the test equipment in FIG. 2 are referred to as a "batch." The five lots unloaded from the test equipment in FIG. 2 are also associated with this batch. The numbers above the arrows in both FIGS. 1 and 2 represent lot numbers. In FIG. 1, the lots being unloaded had the same lot number as the lots being loaded. In FIG. 2, the output lots are renumbered because there is no direct correlation between the input and output lots. The input lots are referred to as "primary lots," and the output lots are referred to as "secondary lots." As will be described later, it is possible that there are a plurality of tests performed on each device. These tests are performed in series. Accordingly, the primary lots fed into the test equipment shown in FIG. 2 may correspond with the secondary lots of a preceding test. The primary lots in FIG. 2 are not necessarily the manufactured lots. Therefore, the manufactured lots are separately referred to as "front end lots" to distinguish them from the primary and secondary lots of the test process.

In FIG. 2, the first four secondary lots contain only devices which pass the test. The fifth and last lot contains both devices that pass the test and devices that fail the test. This fifth lot can be separated into the pass and fail devices so that the fail devices can then be fed back to the test equipment for retesting. Although the number of devices in the first four secondary lots would ordinarily be fixed by the operator, the fifth secondary lot contains whatever devices are left over. Thus, the number of devices in the last secondary lot of each batch would ordinarily be different from the number of devices in the preceding secondary lots.

On the other hand, if the number of input devices for the batch is known in advance and is a whole number multiple of the secondary lots size, then all secondary lots would have the same size. For example, if 2,500 devices were input to the test equipment in each of four primary lots, then five equal sized secondary lots would be produced if each secondary lot had 2,000 devices. The last secondary lot would contain the same number of devices as the preceding lots. However, because the last secondary lot contains both pass and fail devices, the number of pass devices in the last secondary lot would vary.

FIG. 3A shows a schematic layout of a test operation involving two different tests, represented by U4 and U2. For example, these two tests may be a high temperature validation and a low temperature validation. FIG. 3A shows how the devices are subjected to a plurality of test operations. As can be seen, the secondary lot A12654.2 is fed from test U4 to test U2 without waiting for all U4 primary lots to be tested in test U4. Thus, the timing for test U2 overlaps the timing for test U4.

FIG. 3A also shows an option of secondary lot A12654.6 being removed from the test procedure before being subjected to test U2. In this case, test U2 receives a primary lot a A15544.6, which did not originate as a corresponding secondary lot in test U4. With the arrows shown for lots A12654.6 and A15544.6, batch integrity is not maintained. In the middle of testing, some devices are removed from the batch, and other devices, from a different batch, are added to the test process. There are reasons why it may be desirable to maintain batch integrity. If maintained, the secondary lot A12654.6 would be fed directly from test U4 to test U2, as is done for the other U4 secondary lots.

Figure 3B:
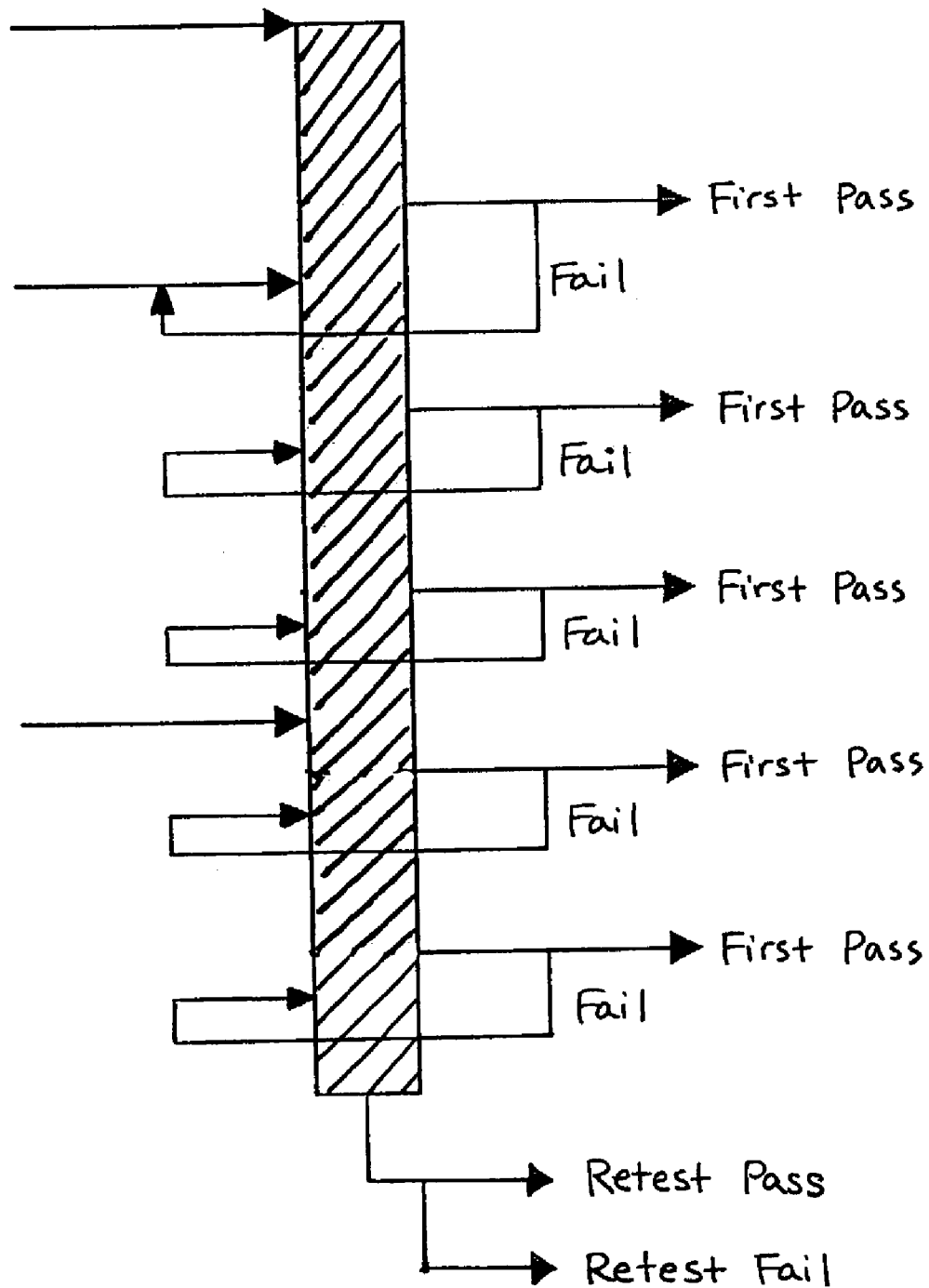
FIGS. 3B–3D show various options for retesting devices.
Figure 3C:
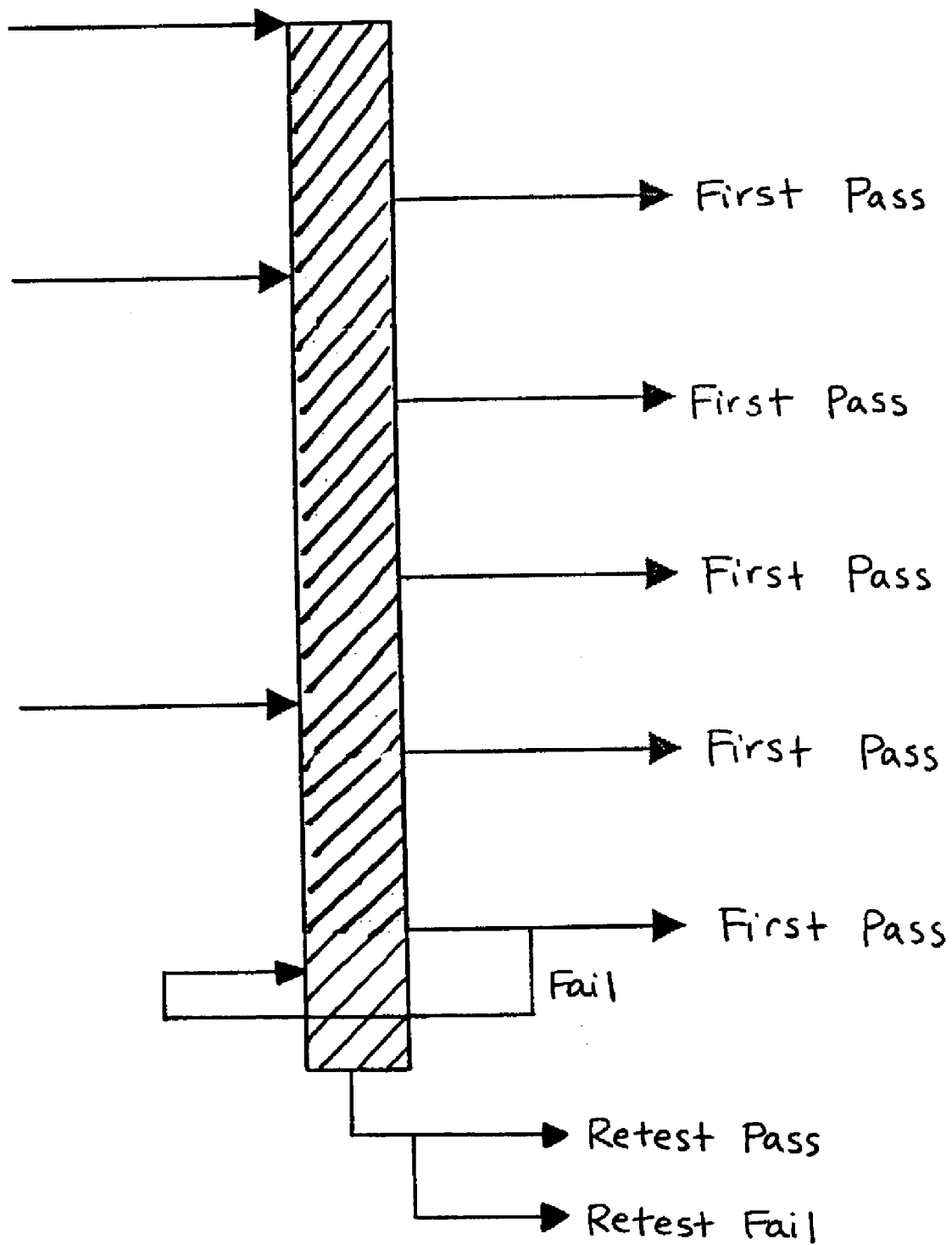
Figure 3D:
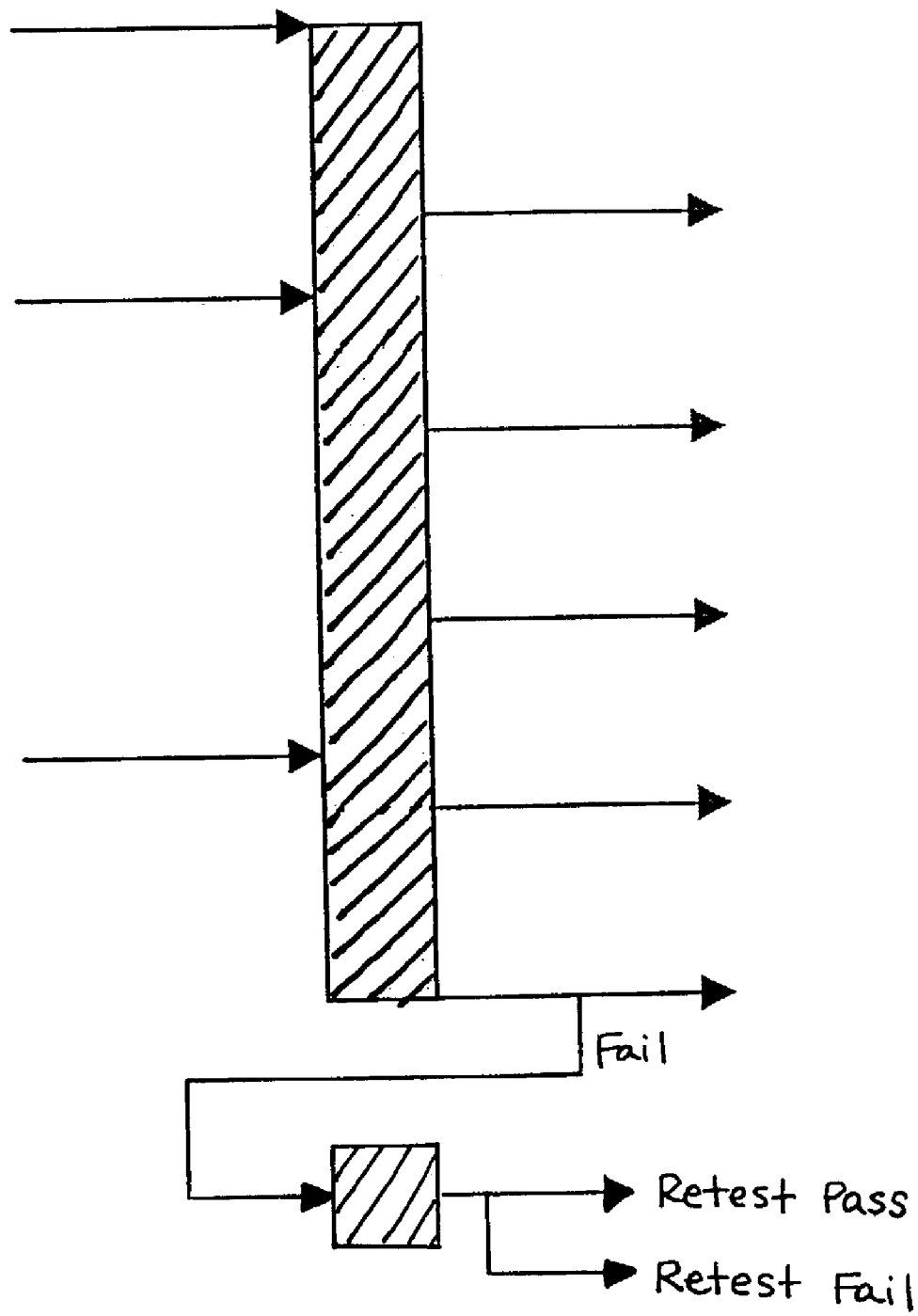

FIGS. 3B–3D show various options for retesting devices. Although a feedback line is shown in FIG. 3A, no detail is provided regarding how retest occurs. FIG. 3B shows a continuous retest process, and FIGS. 3C and 3D show a batch end retest processes. FIG. 3B shows the fail devices being taken out intermittently throughout the batch. Specifically, fail devices are unloaded with each secondary lot. All of FIGS. 3B–3D show the retest devices being taken out together with the pass ("first pass") devices, and show the fail devices being separated from the pass devices. However, this is not essential. That is, the fail devices could be taken out separately from the pass devices. Also, the timing of fail device removal does not necessary coincide with the timing of pass device removal.

In the continual retest process of FIG. 3B, whenever fail devices are removed, the fail devices are then sent to the input of the test equipment. The fail devices are then tested in the same manner as the untested devices.

Referring now to FIGS. 3C and 3D, these drawings relate to a process which retests at batch end. That is, in these drawings, fail devices are not removed until the last secondary batch is finished. The fail devices are then recycled back to the front of the equipment. This can be done in a continuous or non-continuous way. FIG. 3C relates to the continuous process, in which fail devices are recirculated to the front of the test equipment without resetting the test equipment. FIG. 3D shows a non-continuous process. In FIG. 3D, the machine is emptied, prepared for retest and then operated. FIG. 3D shows the retest devices from the batch being tested by themselves. However, there are other options. For example, it is possible to retest the fail devices from a plurality batches at once. Further, the fail devices from first batch can be fed to the test equipment with not-yet-tested devices of a second, subsequent batch. Combinations of the processes shown in FIGS. 3B–3D are also possible.

Figure 4:
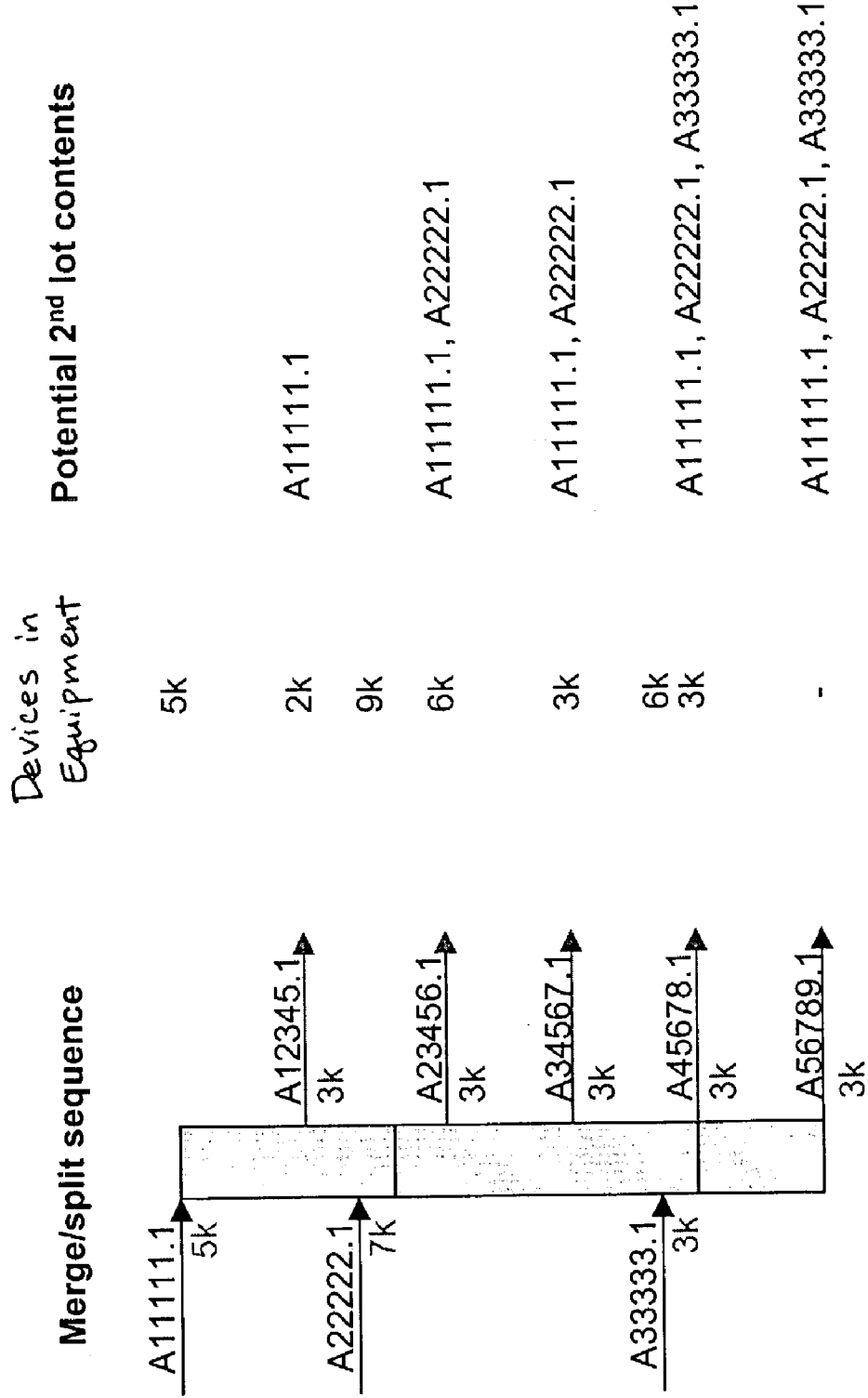
FIG. 4 is a schematic illustration showing how the primary lots are mixed in the test procedure.

FIG. 4 is a schematic illustration showing how the primary lots are mixed in the test procedure. The first secondary lot is removed before the second primary lot has been fed to the test equipment. Thus, the first secondary lot contains only devices from the first primary lot. The primary lot, A22222.1, is fed to the test equipment before the secondary lot, A23456.1 is unloaded. Thus, the secondary lot, A23456.1, would contain devices from both the first and second primary lots. This is true also for the secondary lot A34567.1. Once the primary lot A33333.1 has been fed into the test equipment, it is possible that the secondary lot A45678.1 could contain devices from any of the three primary lots. Although the primary lot 11111.1 was loaded into the test equipment at the very beginning of the batch, the devices are not tested in order. They are mixed within the device. This is why secondary lot A45678.1 potentially contains devices from all three primary lots.

The "devices in equipment" column corresponds to the current number of devices in the test equipment. After loading the first primary lot, there are 5,000 devices in the equipment. After unloading the first secondary lot, 2,000 remain. 7,000 devices are loaded with the next primary lot making a total of 9,000 in the equipment at that time. Then, 3,000 devices are unloaded, and so on.

Although the primary lots are mixed during the continuous test flow process, it is still possible to determine from which front end lot each device originated. Specifically, in the manufacture process, a front end lot identifier is included in the device. This front end lot identifier can be read by the test equipment so that the test data can be associated with a specific front end lot.

Referring back to FIG. 3A, once a secondary lot is unloaded from the test equipment, test data relating to that secondary lot is available. To improve efficiency, this test data is uploaded to a database without waiting for all secondary lots to be completed. The database includes front end data summaries relating to each of the front end lots. The test data for each device is associated with the respective front end data summary. This is done when the data is uploaded to the database.

For the first primary lot fed to the test equipment, for example, testing may not be completed until the last secondary lot of the batch. This is because the fail devices from the first primary lot are not unloaded until the end of the batch and because there is mixing within the test equipment. Thus, complete test data for the first primary lot will not be available until the batch is completed. After the first secondary lot, when additional secondary lots are produced, test data is similarly uploaded to the database, sorted to the appropriate data summary, and saved. For example, if secondary lot 4 contains chips from front end lots 1–4, then the data summaries for four front end lots must be updated when secondary lot 4 is completed. In this manner, there is data aggregation for the various front end lots until the batch is complete.

Figure 5:
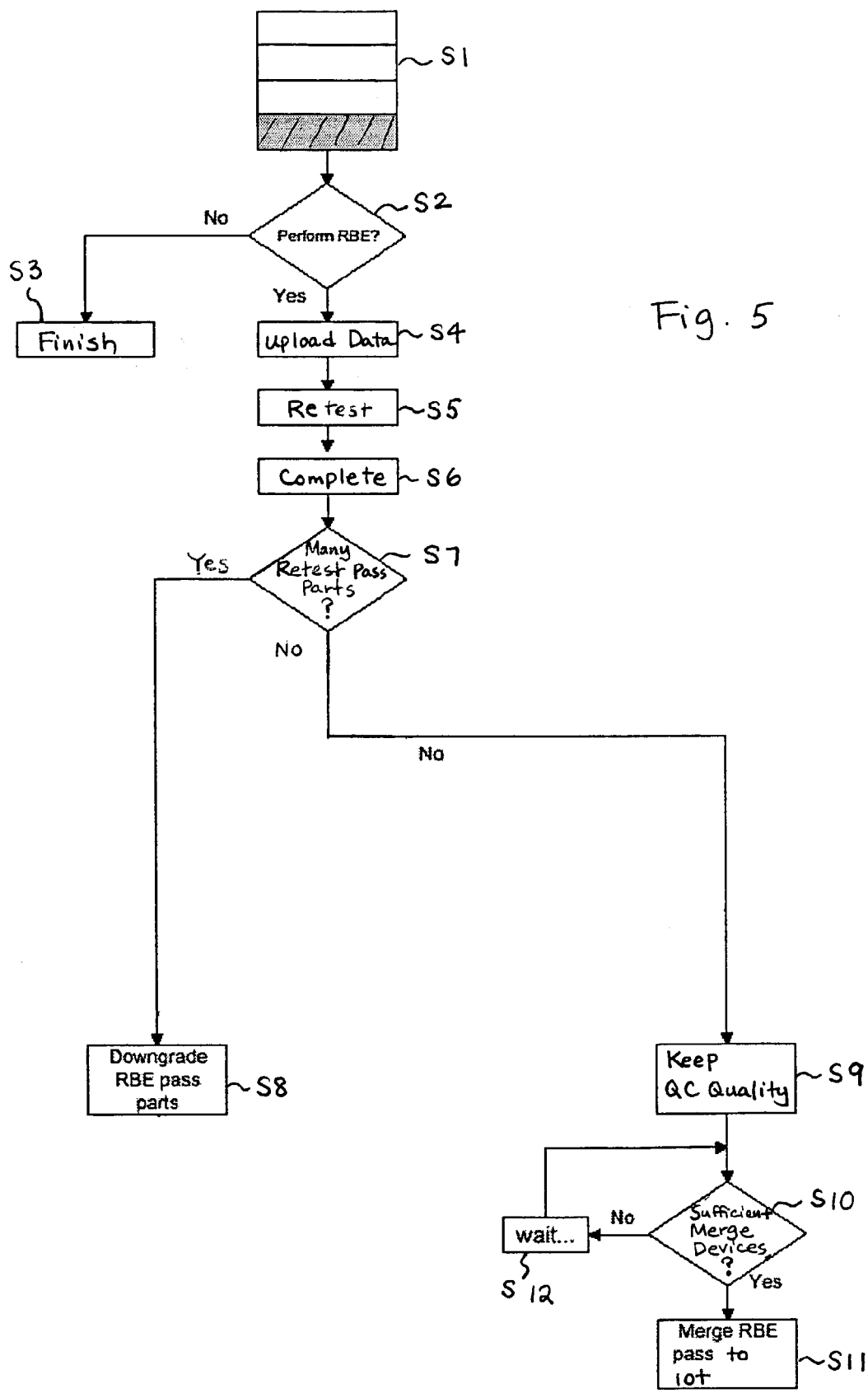
FIG. 5 is a flow-chart showing one possible way that the continuous test flow operation may be performed.

FIG. 5 is a flow-chart showing one possible way that the continuous test flow operation may be performed. At S1, the test process shown in FIG. 2 is performed. The cross-hatching at the bottom of S1 indicates that the last secondary lot contains both pass and fail devices.

At S2, a decision is made whether a retest procedure is necessary. "RBE" represents Retest at Batch End. Retest might not be performed, for example, because the test equipment has to be maintained or because substantially all of the devices have passed the first test run, in which case it may be inefficient to test only the few fail devices. If retest is not performed, the process is finished at S3. At S4, data from the last secondary lot is uploaded into the database. Thus, at S4, data aggregation to the "floating" front end data summaries is completed except for the data, which will be obtained from the retest.

At S5, retest at batch end is performed such that retest is performed on all devices which failed the first round of testing. This first round of testing of course relates to only one test, for example, one of tests U4 and U2. To ensure high quality, it is assumed that the retest pass devices have a lower quality than the first pass devices. It would be undesirable for any single purchaser to obtain a significant quantity of devices, which have questionable quality. The remaining steps of the flow-chart are somewhat optional, and relate to ensuring that no single purchaser receives many retest pass devices.

After completing retest at S6, S7 determines whether the number of retest pass devices exceeds a predetermined limit. If there are many retest pass devices, one option is to downgrade the retest pass devices at S8. In this case, any purchaser would be aware there is perhaps a slightly greater potential for problems with these devices. S7 is somewhat optional. It is possible that all retest pass devices could be downgraded, regardless of how many are produced.

If the number of retest pass devices is not greater than the predetermined limit, one option would be to maintain the quality of the retest pass devices (S9) and mix the limited number of retest pass devices with devices which passed on the first run through the test. Accordingly, at S10, it is determined whether there is a sufficient number of first pass devices to dilute the concentration of retest pass devices. Of course, the devices used for dilution must be the same type of devices as the retest pass devices. If there are sufficient first pass devices, then the retest pass devices are merged with the first pass devices at S11. Otherwise, the process waits for a sufficient number of first pass devices to be available. This occurs at S12.

The invention has been described in detail with particular reference to preferred embodiments thereof and examples, but it will be understood that variations and modifications can be effected within the spirit and scope of the invention.

What is claimed is:

1. A method for testing devices produced in pre-test lots, comprising:
   loading a plurality of pre-test lots into a tester without requiring the tester to complete tests on a previous pre-test lot;
   unloading a post-test lot of devices from the tester, the post-test lot containing devices from a plurality of pre-test lots, wherein a plurality of pre-test lots form a batch,
   a plurality of post-test lots are unloaded from the tester corresponding to the pre-test lots of the batch, and
   the method further comprises:
      determining the number of failed devices in the batch;
      if the number of failed devices exceeds a limit number, determining which pre-test lot corresponds to the failed devices; and
      subjecting the pre-test lot contributing to the failed devices to additional scrutiny.

2. A method for testing devices according to claim 1, wherein the devices of the pre-test lot contributing to the failed devices are sorted from the post-test lot.

3. A method for testing devices according to claim 2, wherein the devices of the pre-test lot are sorted only if at least a predetermined number of failed devices originated from the pre-test lot.

4. A method for testing devices according to claim 1, wherein the pre-test lot is subjected to additional scrutiny only if at least a predetermined number of failed devices originated from the pre-test lot.

5. A method for testing devices produced in pre-test lots, comprising:
   loading a plurality of pre-test lots into a tester without requiring the tester to complete tests on a previous pre-test lot;
   unloading a post-test lot of devices from the tester, the post-test lot containing devices from a plurality of pre-test lots;
   determining the number of failed devices in the post-test lot;
   if the number of failed devices exceeds a limit number, determining which pre-test lots correspond to the devices in the post-test lot; and
   subjecting the pre-test lots contributing to the post-test lot to additional scrutiny.

* * * * *